United States Patent [19]
Béchade et al.

[11] Patent Number: 5,278,456
[45] Date of Patent: Jan. 11, 1994

[54] PROCESS INDEPENDENT DIGITAL CLOCK SIGNAL SHAPING NETWORK

[75] Inventors: Roland A. Béchade, South Burlington; Bruce A. Kauffmann, Jericho, both of Vt.

[73] Assignee: International Business Machines Corporation, Armonk, N.Y.

[21] Appl. No.: 91,468

[22] Filed: Jul. 13, 1993

Related U.S. Application Data

[63] Continuation of Ser. No. 937,545, Aug. 28, 1992, abandoned, which is a continuation of Ser. No. 720,079, Jun. 24, 1991, Pat. No. 5,179,294.

[51] Int. Cl.⁵ .................. H03K 3/017; H03K 5/04
[52] U.S. Cl. .................... 307/265; 307/269; 328/58
[58] Field of Search ............ 307/265, 269, 480, 268, 307/234, 271; 328/63, 58, 72

[56] References Cited

U.S. PATENT DOCUMENTS

| | | | |
|---|---|---|---|
| 3,629,710 | 12/1971 | Durland | 307/265 |
| 3,836,858 | 9/1974 | Kitano | 307/265 |
| 3,840,815 | 10/1974 | Masters | 307/265 |
| 3,958,182 | 5/1976 | Sauthier | 307/265 |
| 4,191,998 | 3/1980 | Carmody | 364/200 |
| 4,236,114 | 11/1980 | Sasaki | 328/58 |
| 4,330,751 | 5/1982 | Swain | 307/265 |
| 4,511,846 | 4/1986 | Nagy et al. | 307/265 |
| 4,623,846 | 11/1986 | LaMacchia | 307/265 |
| 4,726,045 | 2/1988 | Caspell et al. | 377/110 |
| 4,745,573 | 5/1988 | Lebel | 364/900 |
| 4,761,567 | 8/1988 | Walters, Jr. et al. | 307/269 |
| 4,819,164 | 4/1989 | Branson | 364/200 |
| 5,059,818 | 10/1991 | Witt et al. | 307/265 |
| 5,124,573 | 6/1992 | Wong | 307/265 |

OTHER PUBLICATIONS

James Miller, Ben Roberts, Paul Madland "High Performance Circuits for the i486 Processor," Proc. Custom Integrated Circuit Conference, Oct. 2-4, 1989, pp. 188-192.

Primary Examiner—Timothy P. Callahan
Attorney, Agent, or Firm—Heslin & Rothenberg

[57] ABSTRACT

A process independent digital clock shaping network is described for generating an internal clock signal having preset high state ($T_{on}$) and low state ($T_{off}$) intervals per cycle from a received clock signal having a substantially constant period but variable $T_{on}$ and $T_{off}$ intervals per cycle. The shaping network utilizes a set/reset latch to output the desired clock signal. The set input to the latch receives a set pulse generated at the beginning of each cycle of the received clock signal and the reset input to the latch receives a reset pulse generated by control logic circuitry. The logic circuitry uses the frequency of the received clock signal to generate a reset pulse at the appropriate time for gating of the latch to produce an output clock signal having the desired $T_{on}$ and $T_{off}$ intervals per cycle.

4 Claims, 5 Drawing Sheets

PROCESS INDEPENDENT DIGITAL CLOCK SIGNAL SHAPING NETWORK

This application is a continuation of application Ser. No. 07/937,545, filed Aug. 28, 1992, abandoned, and is a continuation of application Ser. No. 07/720,079, filed Jun. 24, 1991, now U.S. Pat. No. 5,179,294.

BACKGROUND OF THE INVENTION

1. Technical Field

This invention relates in general to integrated semiconductor chip timing or clock circuitry and, more particularly, to a digital network for generating an internal clock signal of desired shape from an external clock signal having a variable duty cycle.

2. Description of the Prior Art

Oscillator inputs to integrated circuit chips typically have poor duty cycle resolution, i.e., varying the time within a given clock cycle when the clock signal, for example, drops from a high state ($T_{on}$) to a low state ($T_{off}$). Often, a commercially available oscillator may have a $T_{on}/T_{off}$ ratio per cycle of anywhere from 30/70 to 70/30 for a clock signal rated at 50/50. To eliminate this variation, microprocessor clock generators traditionally divide the input clock frequency to provide the required clock waveform. For example, a symmetrical clock signal can be obtained by dividing the input clock frequency by two, since the period of the input clock signal is assumed constant. To obtain this symmetrical clock signal, however, the resultant frequency is reduced to one-half the input clock frequency. As the performance of microprocessors is pushed to higher and higher frequencies, providing and distributing 2× frequency external clocks in a system is becoming increasingly more difficult. By way of example, using the conventional shaping technique it is necessary to drive a chip with a 100 MHz oscillator to operate at 50 MHz with a symmetrical clock signal. This 2× requirement can obviously adversely effect circuit cost and performance characteristics as integrated circuit frequencies increase.

A different signal processing approach is described in an article by Miller et al., of Intel Corporation, entitled "High Performance Circuits for the i486 TM Processor," Proc. Custom Integrated Circuit Conference, Oct. 2-4, 1989, pp 188-192. This shaping approach uses a 1× clock input circuit to ease the timing requirements of the above-described 2× signal dividing technique. In the described approach, the duty cycle (or $T_{on}/T_{off}$ ratio) for the 1× circuit clock signal follows the duty cycle of the input clock signal. Performance of the processor clock generator is maintained by use of a regulator circuit to adjust the internal clock duty cycle independently of the input clock pulse width. Although providing a 1× clock signal, the clock regulator uses current mirror transistors and an overlap detector, both of which include charging capacitors which are sensitive to process parameters such as temperature and voltage. Further, this 1× clock generator circuit only operates within a limited frequency range. If the input frequency varies sufficiently for any reason, then the circuit will fail to operate.

Thus, there is a genuine need in the art for a process independent digital clock shaping network capable of generating, for example, a 1× symmetrical clock signal from an input clock signal have a variable $T_{on}/T_{off}$ ratio per cycle.

SUMMARY OF THE INVENTION

Briefly described, this invention comprises a semiconductor chip circuit for generating an internal clock signal having preset $T_{on}$ and $T_{off}$ intervals per cycle from a received clock signal having a substantially constant period and variable $T_{on}$ and $T_{off}$ intervals per cycle. The circuit includes generating means for producing a set pulse commensurate with the beginning of a period of the received clock signal. The set pulse is provided to the set input of a set/reset latch which outputs the desired internal clock signal. The latch responds to receipt of the set pulse by initiating output of an internal clock signal cycle. Digital generating means are also provided for producing a reset pulse using the period of the received clock signal. The reset pulse, which is output to the reset input of the latch, is timed to reset the latch and thereby produce the preset $T_{on}$ and $T_{off}$ intervals per cycle of the internal clock signal. If desired, the generated internal clock signal frequency can equal the received clock signal frequency. Further, the circuit can be configured such that the desired $T_{on}/T_{off}$ ratio per cycle in the internal clock signal equals substantially one or can be configured to equal a number other than one.

In a more specific embodiment, the invention comprises a digital clock signal shaping network which receives an input clock signal having a substantially constant period and a variable $T_{on}/T_{off}$ ratio per cycle and outputs in response thereto a clock signal having a desired $T_{on}/T_{off}$ ratio per cycle. The shaping network includes a delay circuit having an input coupled to receive the input clock signal, and a plurality of outputs. The delay circuit includes a plurality of serially connected delay stages each of which outputs a corresponding delay signal as the input clock signal propagates through the delay circuit. A plurality of pulse generators are coupled to receive the delay circuit delay signals and output in response thereto pulse signals of short duration. A set/reset output latch produces the clock signal of desired $T_{on}/T_{off}$ ratio per cycle. The set input to the latch receives the pulse signal output from the first of the plurality of pulse generators. A reset logic circuit is coupled between the plurality of pulse generators and the reset input to the latch for timely resetting of the latch. The logic network receives as inputs the pulse signals output from the plurality of pulse generators. A reset signal is output from the logic circuit and is timed to produce the preset $T_{on}/T_{off}$ ratio per cycle for the outputted clock signal. Numerous circuit enhancements are also described and claimed herein.

To summarize, the present invention comprises a clock signal shaping network which can be structured to generate a symmetrical or an asymmetrical clock signal output. The clock output from the network can be configured to very exacting tolerances by adjusting the number of circuits used in the generator. The clock generator is process independent, being totally digital and requiring no analog or external components. In a preferred embodiment, the generator can receive a 1× external clock with very large tolerance in $T_{on}$ and $T_{off}$ intervals per cycle and generate an internal clock of the same frequency with equal $T_{on}$ and $T_{off}$ intervals per cycle. The generator has a wide range of functionality and will even operate at higher and lower frequencies than intended.

BRIEF DESCRIPTION OF THE DRAWINGS

These and other objects, advantages and features of the present invention will be more readily understood from the following detailed description of a certain preferred embodiment of the present invention, when considered in conjunction with the accompanying drawings in which.

DETAILED DESCRIPTION OF THE INVENTION

Reference now is made to the drawings in which the same reference numbers are used throughout the different figures to designate the same or similar components.

Figure 1:
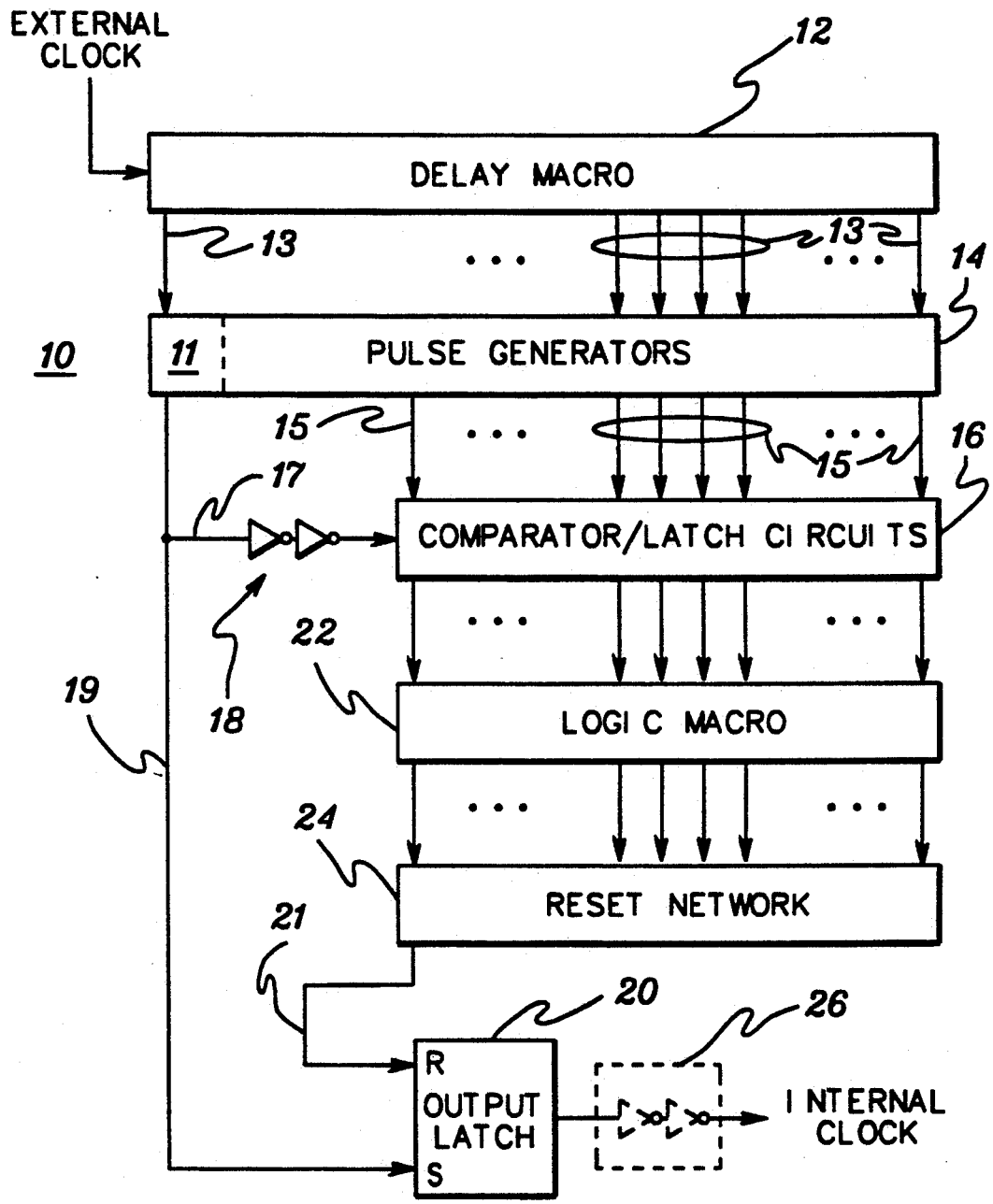
FIG. 1 is a schematic overview of one embodiment of a clock signal shaping network pursuant to the present invention.

FIG. 1 depicts one embodiment of a digital clock signal shaping network, generally denoted 10, pursuant to the present invention. An external clock having a substantially constant frequency but variable $T_{on}$ (high state) and $T_{off}$ (low state) intervals per cycle is received at the input to a delay macro 12. Delay macro 12 outputs a plurality of sequential delay signals on lines 13 to pulse generators 14. Each delay signal, which is delayed from the previously outputted delay signal by the delay of the delay stage therebetween, is fed to a separate one of a plurality of pulse generators 14. Each pulse generator outputs a pulse signal in response to a received delay signal. The pulse signals, which are output on lines 15, are provided to the inputs of comparator/latch circuits 16. A first generator 11 outputs a first pulse signal to circuit 16 through a buffer on line 17, e.g., two serially connected inverters 18. As explained further below, circuits 12, 14, and 16 cooperate to continuously determine the frequency (or period) of the external clock signal input to network 10.

Network 10 further includes a set/reset output latch 20 which is controlled to produce the desired internal clock signal. Latch 20 is initially set by the first generated pulse signal sequentially output on line 19 from circuit 14 to its set input "S". The reset input "R" to latch 20 receives, via line 21, a reset control signal which is generated by a logic macro 22 and a reset network 24 coupled thereto. Circuit 22 functions to isolate the first latch on circuit 16 to identify a pulse signal as repeating. A signal from this isolated latch enables the reset signal to be transmitted to the reset input "R" of latch 20. By way of example, in one useful embodiment, reset network 24 can be configured to generate a reset signal commensurate with the midpoint of the external clock period (as discussed below), thereby producing a symmetrical clock signal at the output of latch 20. If desired, a buffer 26 may be connected to the output of latch 20 to reduce the loading thereon.

A more detailed description of each of the major circuit components of network 10 is provided below with reference to FIGS. 2-6.

Figure 2:
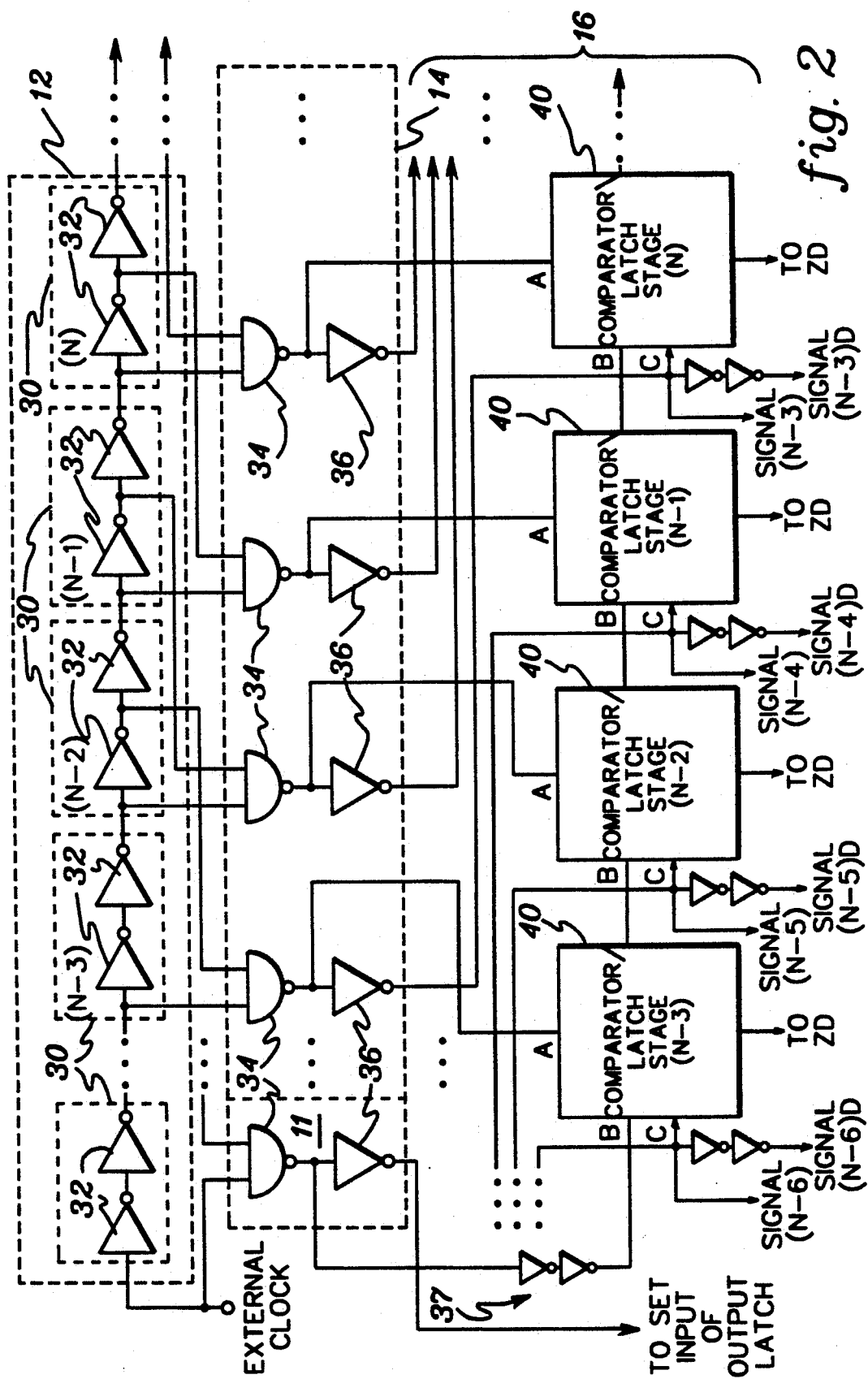
FIG. 2 is a more detailed schematic of the delay macro, pulse generators and comparator/latch circuits of the network embodiment of FIG. 1.

Referring first to FIG. 2, one embodiment of circuitry components 12, 14 and 16 which continually monitor the external clock frequency is shown. Delay macro 12 includes a plurality of serially connected delay stages 30, each of which includes, e.g., two inverters 32. (Those skilled in the art will recognize that alternative delay circuitry could also be used.) The output of the first inverter in each stage is connected to the input of the second inverter therein. The delay stages cooperate to sequentially produce the delay signals output therefrom. Each outputted delay signal comprises the external clock signal delayed by the amount of corresponding delay in circuit 12 preceding the signal's output. Along with the first delay stage, stages (N), (N-1), (N-2) and (N-3) out of the plurality of delay stages are depicted for discussion. In general, lowering the delay/stage time and increasing the number of delay stages 30, along with the subsequent circuitry corresponding thereto (described below), improves the resolution of the waveform output from shaping network 10 This is particularly true if the input clock frequency is relatively low, e.g., 1 MHz or below.

Figure 3:
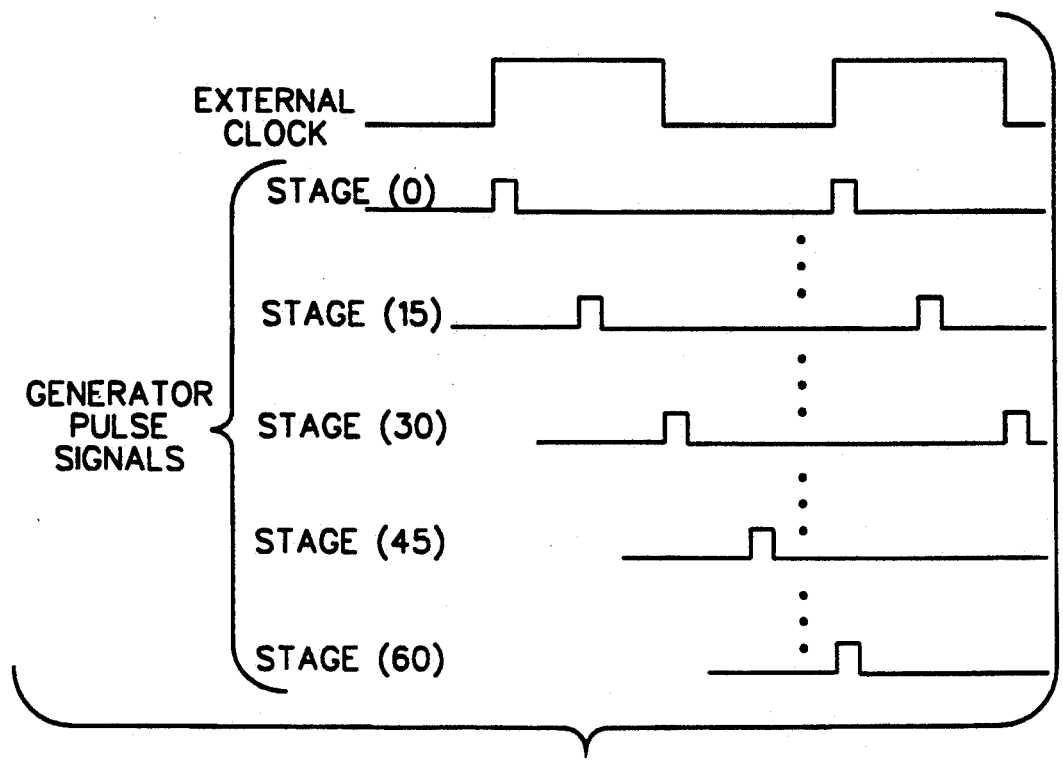
FIG. 3 is a timing diagram of the received external clock signal in comparison with several generated pulse signals output from the pulse generators of FIG. 2.

Again, the delay clock signals output from the delay line delay stages are input to generating circuit 14, which includes a plurality of pulse generators. Preferably, there is one pulse generator for each delay stage of network 10. In the embodiment shown, each pulse generator includes a two input NAND gate 34, which has a first input tied to an input of the corresponding delay stage and a second input tied to delay macro 12, for example, at one and a half delay stages subsequent thereto. The delay between the clock signals presented at the two NAND gate inputs is determinative of the width of the pulse signal outputted from the NAND gate. However, in this embodiment it is necessary to have the two input signals be offset by an odd number of delay inverters in order to define a difference with which to output a signal. Each NAND gate 34 output passes through an inverter 36. By way of example, FIG. 3 depicts a sample external clock waveform and certain generated pulses to be output from circuit 14, i.e., a pulse signal corresponding to stage (0), stage (15), stage (30), stage (45) and stage (60). (The figure assumes that the external clock repeats at stage (60).) As shown in FIG. 2, the signals from both gates 34 and inverters 36 are applied to associated comparator/latch circuits 16.

The connections to circuit 16 (FIG. 1) are also shown in greater detail in FIG. 2. As noted, circuit 16 includes a plurality of stages or which only comparator/latch stages (N-3) through stage (N) are shown. In practice, the number of comparator/latch stages may be less than the number of pulse generating stages (which preferably equal the number of delay stages in circuit 12). This is because the function of these circuits is to identify the pulse signal corresponding to a complete period of the external clock signal input to macro 12. If, for example, there are 66 delay stages to delay macro 12 and 66 pulse generator stages to circuit 14, less than 66 comparator/latch stages may be used since it can typically be assumed that the external clock signal will not repeat within a certain number of initial delay stages. For example, within the first ten stages. Network 10 is configured to accommodate a specific clock signal frequency or a specific range of clock signal frequencies. $T_{on}$, $T_{off}$ switching accuracy is obviously reduced should the external clock signal repeat at the 10th stage or below in comparison with, for example, noting repetition at the 40th stage of a 66 stage network. In the discussion below, therefore, it is assumed that examination for coincidence of signals is begun at delay stage 11 (which will comprise the first comparator/latch stage 40).

In the embodiment shown, each comparator/latch stage 40 has three inputs; namely, an A input for receiving the pulse signal output from the corresponding pulse generator stage (for the comparator/latch circuit 40 described below in connection with FIG. 4 this signal is taken directly at the output of the corresponding NAND gate 34), an input B for receiving the first pulse signal output from pulse generator 11 (FIG. 1), and a reset input, input C, for receiving the (N-3) pulse signal. The pulse signal from inverter 36 of the first generator stage 11 (FIG. 1), after passing through a double invert buffer, is applied to each of the comparator/latch stages 40 at input B.

Figure 4:
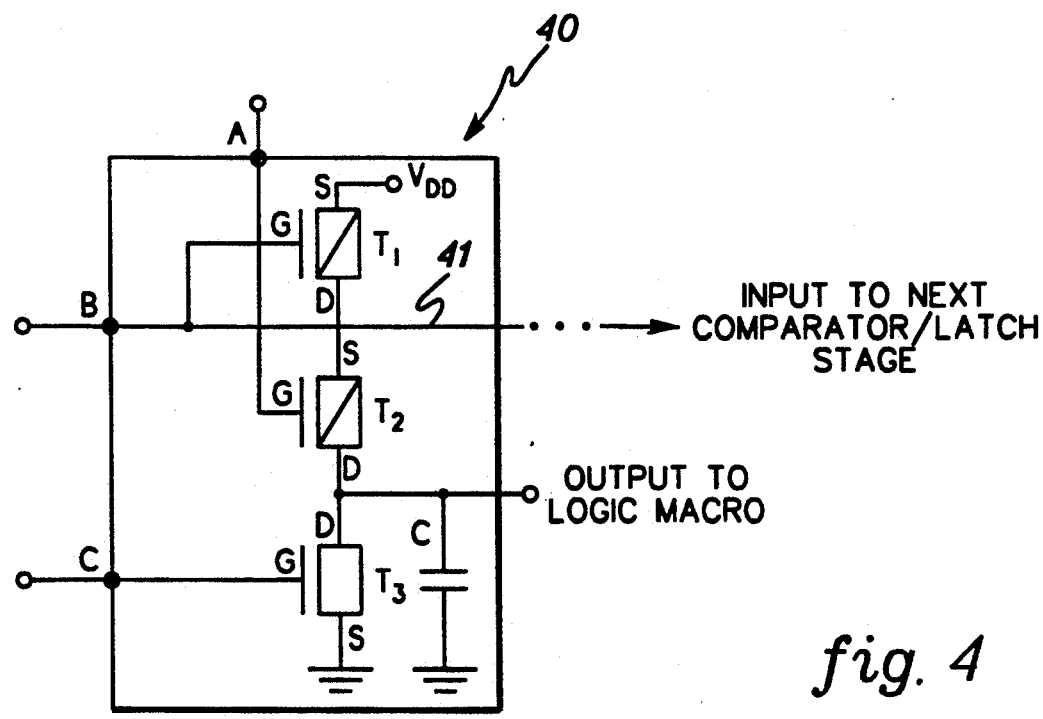
FIG. 4 is a schematic of one embodiment of the comparator/latch stage circuit of FIG. 2.

Referring to FIG. 4, a preferred embodiment of the comparator/latch stage circuit 40 is shown. The circuit includes complementary metal oxide semiconductor (CMOS) circuits with P-channel field-effect transistors (PFETs) indicated in the drawing by a rectangle with a diagonal line formed therein and a control element or gate electrode arranged adjacent thereto and with N-channel field-effect transistors (NFETs) indicated by a rectangle without a diagonal line and with a control element or gate electrode arranged adjacent thereto.

This comparator/latch stage circuit 40 includes a dynamic latch and is most suitable for frequencies of, for example, 1 MHz or above. A first PFET $T_1$ has its source "S" connected to circuit voltage $V_{DD}$ and its drain "D" connected to the source "S" of a second PFET $T_2$. PFET $T_1$ is gated "G" by the first pulse signal outputted from generator 11, which is received at input B to circuit 40. This first pulse signal is also passed through circuit 40, for example, on line 41, to the next adjacent circuit 40 (see FIG. 2) of the plurality of comparator/latch stages. PFET $T_2$ has its drain "D" connected to a first terminal of a capacitor "C", the second terminal of which is connected to ground. PFET $T_2$ is gated "G" by the pulse signal output from the corresponding stage of the pulse generators, which again is received at input A. Thus, in order for charge to flow to capacitor "C", the pulse signals received at input A and input B must simultaneously activate the respective PFETs. This is only true when the external clock signal begins to repeat (Compare, e.g., the pulse signals at stage (0) and stage (60) in FIG. 3). Where the clock signal begins to repeat, the number of delay stages between pulse signal A and pulse signal B is representative of the period (or frequency) of the external clock signal. Should the pulse signals at inputs A and B not overlap, then capacitor "C" remains uncharged.

After an initial pass through the network, at least one comparator/latch stage should be set, i.e., have its capacitor "C" charged as an indication of repetition of the external clock signal. Prior to propagation of the next clock cycle through the network any set latch must be reset. In particular, prior to considering the next corresponding pulse signal at input A, capacitor "C" must be discharged. Reset is accomplished in circuit 40 by an NFET $T_3$ which is coupled in parallel with capacitor "C". NFET $T_3$ has its drain "D" connected to the first terminal of capacitor "C" and its source "S" connected to ground. In the embodiment depicted, the pulse signal from the (N-3) generator stage is supplied to the Nth stage and, in particular, to gate "G" of NFET $T_3$ through input C to circuit 40. When high, this pulse serves to discharge the capacitor so that circuit 40 is cleared prior to consideration of its next corresponding pulse signal (i.e., from stage N) received at input A.

It should be noted that use of the (N-3) pulse signal (i.e., the signal received at input C) to clear the Nth stage is somewhat arbitrary. A different pulse signal could be selected and function equally well so long as the different signal is not generated too far from stage N such that it will interfere with the signal at stage N/2 (assuming a clock signal output with equal $T_{on}$ and $T_{off}$ intervals per cycle is desired) and such that it will not interfere with selection of a new coincidence stage should the input clock period vary (e.g., N+1, N-1, ...), i.e., assuming coincidence was previously located at stage N of the network. The voltage across capacitor "C" comprises the output of circuit 40 to logic macro 22 (FIG. 1). Those skilled in the art will recognize that depending upon the frequency of the external clock signal, it may be desirable to replace the dynamic latch of FIG. 4 with a static latch.

Figure 5:
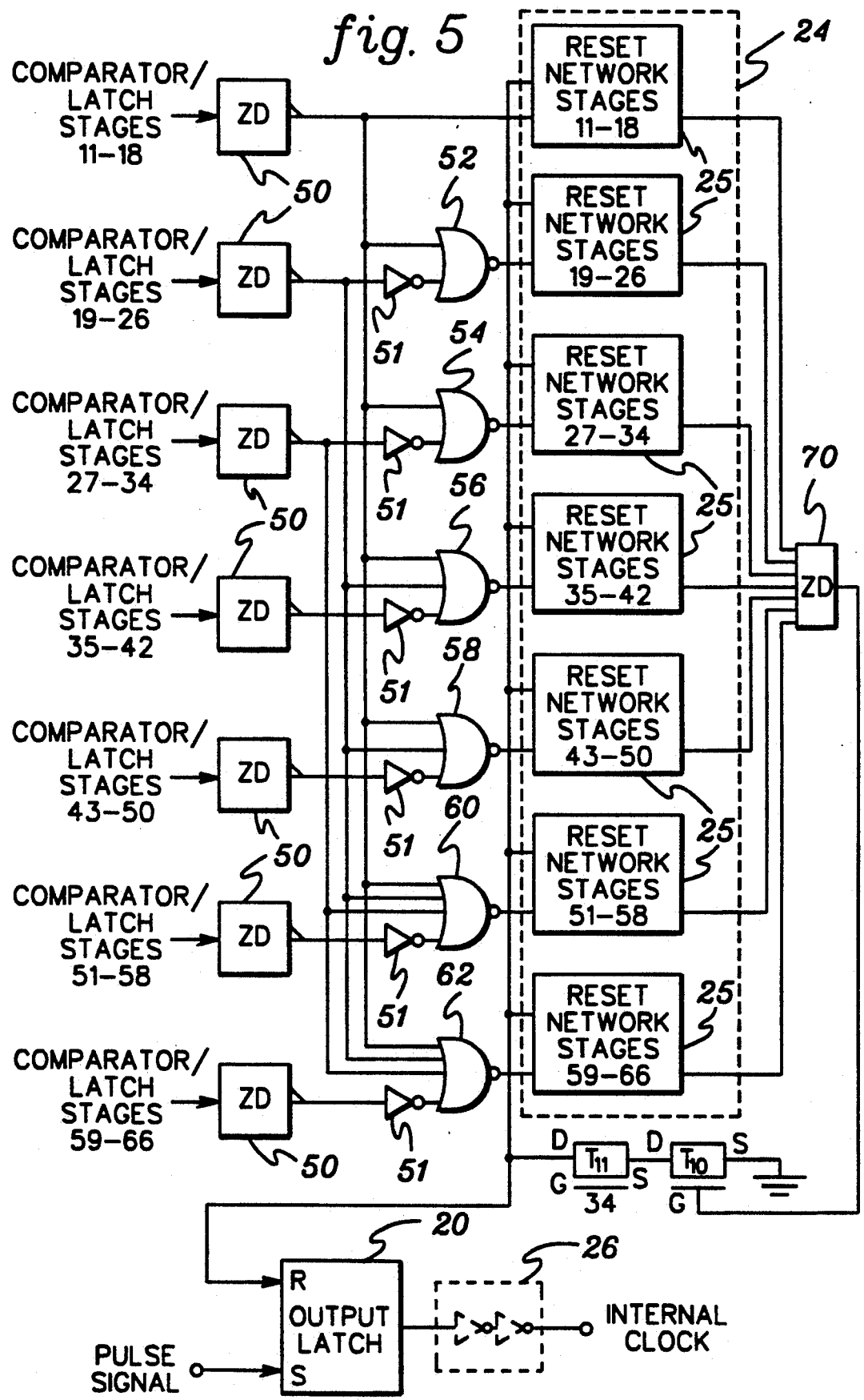
FIG. 5 is a schematic of one embodiment of the control macro and reset network circuit of FIG. 1.

Referring next to FIG. 5, the logic macro observes all comparator/latch stage outputs (i.e., the "To ZD" lines of FIG. 2) and gates to the reset network 24 only the first latch stage to have been set. By way of example, if the delay macro includes 66 stages and the external clock signal input thereto repeats after 20 stages, comparator/latch stages 20, 40 and 60 will be set. The logic macro is configured such that only comparator/latch stage 20 is gated to its output, i.e., to reset network 24. Each zero detect "ZD" circuit 50 at the input to the logic macro is configured, for example, to receive 8 output signals (i.e., the value across capacitor "C" at the output of each circuit 40) from corresponding comparator/latch stages (FIGS. 2 and 4).

As noted above, delay line delay intervals are preferably selected such that the external clock signal will not repeat within a certain number of initial stages, e.g., within the first ten stages. Therefore, comparator/latch stages corresponding to these stages can be omitted, and zero output detection (or more precisely, non-zero output detection) begins with stage 11 as indicated in FIG. 5. The output signal from zero detects 50 are each inverted such that a logic one appears at the output of a detect circuit whenever one of the received comparator/latch stage signals is also a logic one, which as discussed denotes coincidence in signals between the corresponding stage pulse signal and the first generator 11 pulse signal (FIG. 2).

The output of the zero detect circuit 50 receiving signals from stages 11-18 is fed directly to reset network 24 (shown in phantom) and, in particular, to a first network 25 configured specifically for stages 11-18. (In this discussion, it is also assumed that coincidence of signals does not occur within eight stages of each other. This can be guaranteed by selecting the appropriate delays between stages.) The output from the zero detect circuit 50 receiving signals from stages 11-18 is also coupled to a plurality of NOR circuits 52, 54, 56, 58, 60 and 62. The outputs of circuits 52, 54, 56, 58, 60 and 62 are respectively connected to corresponding reset networks 25 for stages 19-26, 27-34, 35-42, 43-50, 51-58 and 59-66. (As discussed below, reset networks 25 each arbitrarily receive eight stages for processing. This is to reduce the capacitive loading on the reset input to output latch 20.)

As a further operational example, the second zero detect circuit 50 receives signals from stages 19-26, and again transmits a logic zero output if none of its inputs are latched. This logic output is passed through an inverter 51 before being received at the input to the corresponding NOR gate, i.e., NOR gate 52. Since one input to NOR gate 52 is thus a logic one, the output is a logic zero and the reset network for stages 19-26 remains disabled. Conversely, if a latch within stages 19-26 is set, then the output of the corresponding zero detect 50 is logic one. This logic output is inverted such that logic zero appears at both inputs to NOR gate 52 resulting in a logic one output therefrom. This also assumes that no latches were set in stages 11-18. (Again, a logic one output from the first zero detect circuit 50 will disable NOR gates 52, 54, 56, 58, 60 and 62. The output of zero detect 50 for stages 19-26 is also input to NOR gates 56, 58, 60 and 62. NOR gates 56, 58, 60 and 62 receive the output of this zero detect circuit 50 since these gates receive at least one latch stage which is a multiple of one of latch stages 19-26. Thus, a logic one output from zero detect 50 for stages 19-26 disables any latch subsequently set which is a multiple thereof through the operation of NOR gates 56, 58, 60 and 62.

The described logic circuitry thus serves to isolate the first latch set to indicate repetition of the inputted external clock signal. One skilled in the art will also note that the same circuits and processing concepts are used for each of the remaining zero detect circuits 50 and their associated NOR gates.

Figure 6:
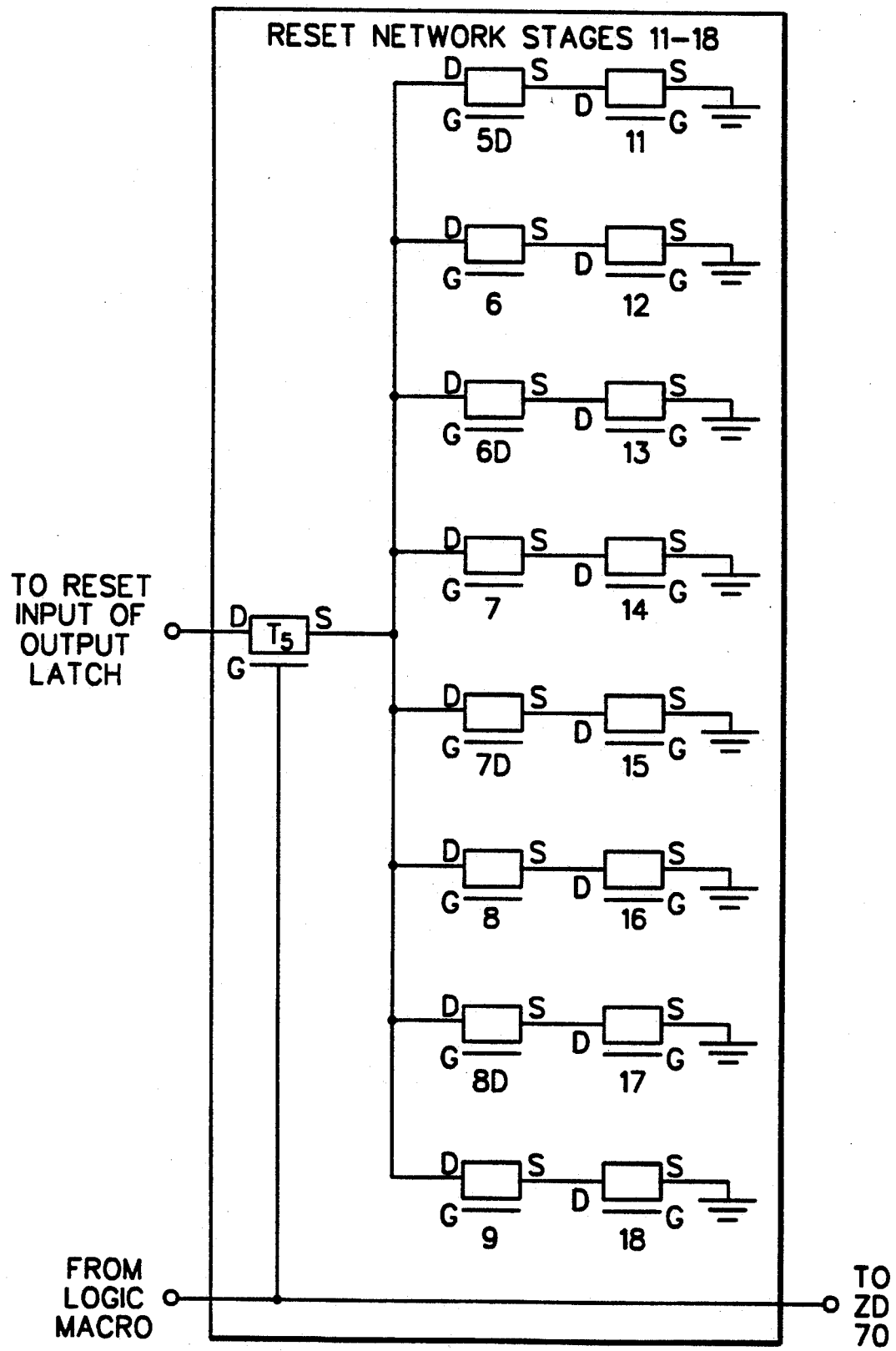
FIG. 6 is a schematic of one embodiment for the reset network stages of FIG. 5.

Reset network stages are each substantially identical, therefore only one network 25 is discussed in detail below. In particular, one embodiment of a reset network for stages 11-18 is depicted in FIG. 6. As shown, a first NFET $T_5$ is gated "G" by the output from the first zero detect 50 (FIG. 5) of the logic macro. The drain "D" of NFET $T_5$ is connected to the reset input "R" to output latch 20, and the source "S" is coupled to the drain "D" of eight first NFETs contained in the parallel pairs of NFETs. The source "S" of each of the first of the parallel pairs of NFETs is coupled to the drain "D" of the second of the pairs of NFETs. The source "S" of each of the second of the parallel pairs of NFETs is coupled to ground. The second NFET in each pair of NFETs receives at its gate "G" one of the latch outputs from one of the respective comparator/latch stages 11-18. The first NFET in each pair of NFETs receives at its gate "G" a pulse signal from a stage which is at a preset relation to the stage having the latch output received at the second NFET in each pair. For example, if the stage gating the second NFET is stage N, then to produce an output clock signal having equal $T_{on}$ and $T_{off}$ intervals the pulse signal gating the first NFET must be from stage N/2, wherein N equals one of stages 11-18. The N/2 pulse signal is received at network 25 with propagation of the next external clock signal through network 10.

Thus, the first NFET of the first pair of NFETs is driven by the pulse signal from stage 5D, wherein D denotes a half a delay stage delay signal. As shown in FIG. 2, pulse signals output from the pulse generators 14 may be used to produce signals which are further delayed by delay stage. This can be readily accomplished by connecting appropriately sized inverters in series and coupling the input to the inverters to an output of the respective pulse generator. The comparator/latch output from stage 11 is therefore coupled with the pulse signal from stage 5D. Similarly, the latch output from stage 12 is coupled with the pulse signal from stage 6, the latch output from stage 13 is coupled with the pulse signal from stage 6D, the latch output from stage 14 is coupled with the pulse signal from stage 7, the latch output from stage 15 is coupled with the pulse signal from stage 7D, the latch output from stage 16 is coupled with the pulse signal from stage 8, the latch output from stage 17 is coupled with the pulse signal from stage 8D, and the latch output from stage 18 is coupled with the pulse signal from stage 9. Each of the remaining reset network stages of reset network 24 may be analogously configured. Those skilled in the art, however, will readily recognize that various configurations may be used to accomplish the function of the reset network. For example, different numbers of stages could be grouped depending upon the need to reduce capacitive loading on the reset input to latch 20.

As noted above, the reset network 24 resets the output latch 20. The control logic surrounding the reset network enables only one group of latches depending upon the position of the repeat pulse in the chain. For example, if the pulse signal from stage N is coincident with the input clock signal, then the input period is N times the basic stage delay. A latch is set at stage N, and this latch gates the pulse signal, for example, from stage N/2 to the reset of the output latch the next time that pulse N/2 is generated. Again, the latch for stage N is reset every cycle by the pulse from stage (N-3) to ensure that continuous sampling of the input clock is obtained.

If an asymmetrical output signal is desired, i.e., reset of the output latch 20 occurs at other than the mid-point of the clock cycle, then each pulse signal N will be coupled with a different proportional signal, for example, a pulse signal from stage N/3 or N/4. Further, the pulse signal could be selected to bias the output clock to account for any circuit delays.

Returning to FIG. 5, if the input frequency is slower than expected, or if the inverter delay is faster than expected, a coincidence in signals may not be obtained. In such a case, it is assumed that the next stage after the last stage repeats and the reset input to the output latch is gated with the pulse signal from stage $(N_{MAX}+1)/2$. This is accomplished by sending the output from each of the grouped control logic stages (i.e., the first zero detect circuit 50, and NOR gates 52, 54, 56, 58, 60 and 62) to the input of a zero detect circuit 70. Circuit 70, which lacks the inversion function of circuits 50, outputs a logic one signal whenever all of its inputs are zero, i.e., meaning none of the reset network stages 25 were enabled.

The output of zero detect circuit 70 is applied to the gate "G" of a first NFET $T_{10}$ of two serially connected NFETs $T_{10}$ and $T_{11}$. The source "S" of NFET $T_{10}$ is connected to ground while the drain "D" is connected to the source "S" of NFET $T_{11}$. NFET $T_{11}$ receives at its gate "G" the pulse signal output from the 34th stage of the pulse generators (assuming $N_{MAX}=66$ stages) and the drain "D" is coupled to the reset input of output latch 20. Thus, when no repetition of the input signal occurs, zero detect circuit 70 activates NFET $T_{10}$, and with the next generation of pulse signals the signal from stage 34 causes resetting of output latch 20. It will be observed, that in the absence of coincidence, using this technique the $T_{on}$ interval may be shorter than the $T_{off}$ time. However, it is not believed that this will be significant since the chip should be fast enough to operate properly under these conditions. Again, the delays through network 10 will be selected based on the anticipated external clock frequency to be inputted.

It will be observed from the above discussion that a clock signal shaping network is provided which is process independent and can be structured to generate either a symmetrical or an asymmetrical clock signal output. Further, the clock output from the network can be configured to very exacting tolerances by adjusting the number of stages used in the generator. The clock generator is totally digital and requires no analog or external components. In the presently preferred embodiment, the generator can receive a 1× external clock with very large tolerance in the $T_{on}$ and $T_{off}$ intervals per cycle and generate an internal clock of the same frequency with equal $T_{on}$ and $T_{off}$ intervals per cycle. The generator has a significant range of operability and will even operate at higher and lower frequencies than intended.

Although a specific embodiment of the present invention has been illustrated in the accompanying drawings and described in the foregoing detailed description, it will be understood that the invention is not limited to the particular embodiments described herein, but is capable of numerous rearrangements, modifications, and substitutions without departing from the scope of the invention. The following claims are intended to encompass all such modifications.

What is claimed is:

1. Semiconductor chip circuit for generating an internal clock signal having constant $T_{on}$ and $T_{off}$ intervals per cycle from a received clock signal having a period within a range of potential periods and variable $T_{on}$ and $T_{off}$ intervals per cycle, said circuit comprising:

automated means for periodically generating a set pulse synchronized with the beginning of a corresponding period of said received clock signal, each corresponding period of said received clock signal being within said range of potential periods;

a latch for outputting said internal clock signal, said latch having a set input and a reset input, said latch receiving each generated set pulse at its set input and responding thereto by initiating output of an internal clock signal; and digital means for automatically adaptively generating a reset pulse for each generated set pulse, each reset pulse being generated relative to the corresponding period of said received clock signal, and each reset pulse being output to the reset input of said latch, said digital means including timing means for generating within a substantially constant fraction of the received clock signal's corresponding period said reset pulse to reset said latch and thereby produce said constant $T_{on}$ and $T_{off}$ intervals per cycle of said internal clock signal output from said latch notwithstanding variation in the period of said received clock signal within said range of potential periods.

2. The circuit of claim 1, wherein the internal clock signal has a frequency and wherein said frequency equals said received clock signal frequency.

3. The circuit of claim 1, wherein the constant $T_{on}$ and $T_{off}$ intervals define a $T_{on}/T_{off}$ ratio per cycle of said internal clock signal and wherein said $T_{on}/T_{off}$ ratio is substantially one.

4. The circuit of claim 1, wherein the constant $T_{on}$ and $T_{off}$ intervals define a $T_{on}/T_{off}$ ratio per cycle of said internal clock signal and wherein said $T_{on}/T_{off}$ ratio equals other than one.

* * * * *